United States Patent
Hayashi et al.

(10) Patent No.: US 11,598,746 B2
(45) Date of Patent: Mar. 7, 2023

(54) GAS SENSOR

(71) Applicant: Kabushiki Kaisha Toshiba, Minato-ku (JP)

(72) Inventors: Yumi Hayashi, Ayase (JP); Akihiro Kojima, Suginami (JP); Hiroaki Yamazaki, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 669 days.

(21) Appl. No.: 16/592,984

(22) Filed: Oct. 4, 2019

(65) Prior Publication Data
US 2020/0300803 A1    Sep. 24, 2020

(30) Foreign Application Priority Data

Mar. 18, 2019 (JP) .............................. JP2019-050180

(51) Int. Cl.
*G01N 27/407* (2006.01)
*H01L 23/532* (2006.01)
*G01N 27/22* (2006.01)

(52) U.S. Cl.
CPC ....... *G01N 27/4074* (2013.01); *G01N 27/226* (2013.01); *H01L 23/53209* (2013.01); *G01N 2027/222* (2013.01)

(58) Field of Classification Search
CPC ............ G01N 27/4074; G01N 27/226; G01N 2027/222; H01L 23/53209
See application file for complete search history.

(56) References Cited

U.S. PATENT DOCUMENTS

2017/0343522 A1\* 11/2017 Ikehashi .................. G01B 7/22
2019/0162694 A1  5/2019 Hayashi

FOREIGN PATENT DOCUMENTS

| JP | 2001-296238 A | 10/2001 |
| JP | 2008-8869 A | 1/2008 |
| JP | 2017-215170 A | 12/2017 |
| JP | 2019-100705 A | 6/2019 |

OTHER PUBLICATIONS

Hayashi et al. (Y Hayashi, H Yamazaki, D Ono, K Masunishi, T Ikehashi, Investigation of Pd—Cu—Si metallic glass film for hysteresis-free and fast response capacitive MEMS hydrogen sensors, Transducers 2017, Kaohsiung, Taiwan, Jun. 18-22, 2017) (Year: 2017).\*
Kajita et al. (S Kajita, S-I Yamaura, H Kimura, A Inoue, Hydrogen sensing ability of Pd-based amorphous alloys, Sensors and Actuators B 150 (2010) 279-284) (Year: 2010).\*
Yamazaki et al. (H Yamazaki, Y Hayashi, K Masunishi, D Ono, T Ikehashi, A high sensitivity MEMS capacitive hydrogen sensor with inverted T-shaped electrode and ring-shaped palladium, Transducers 2017, Kaohsiung, Taiwan, Jun. 18-22, 2017) (Year: 2017).\*

(Continued)

*Primary Examiner* — Joshua L Allen
(74) *Attorney, Agent, or Firm* — Oblon, McClelland, Maier & Neustadt, L.L.P.

(57) ABSTRACT

In one embodiment, a gas sensor includes a sensing layer having a first region containing PdCuSi, and a second region which is provided outside the first region and contains PdCu.

19 Claims, 7 Drawing Sheets

(56) References Cited

OTHER PUBLICATIONS

Kajita et al. (S Kajita, S-I Yamaura, H Kimura, A Inoue, Composition control of Pd—Cu—Si metallic glassy alloys for thin film hydrogen sensor, Materials Transactions 51(12) (2010) 2133-2138) (Year: 2010).*

Hayashi, Yumi et al., "Investigation of Pd—Cu—Si Metallic Glass Film for Hysterisis-free and Fast Response Capacitive MEMS Hydrogen Sensors", 2017 $19^{TH}$, International Conference On Solid-State Sensors, Actuators and Microsystems (Transducers), Jun. 18, 2017, pp. 311-314.

\* cited by examiner

GAS SENSOR

CROSS-REFERENCE TO RELATED APPLICATION

This application is based upon and claims the benefit of priority from the prior Japanese Patent Application No. 2019-050180, filed on Mar. 18, 2019, the entire contents of which are incorporated herein by reference.

FIELD

Embodiments described herein relate generally to a gas sensor.

BACKGROUND

Gas sensors (hydrogen gas sensors, and so on) using a MEMS (micro electro-mechanical systems) technology have been proposed.

However, it is not necessarily said that conventionally gas sensors having sufficient performance have been proposed.

DETAILED DESCRIPTION

According to one embodiment, a gas sensor includes a sensing layer having a first region containing PbCuSi, and a second region which is provided outside the first region and contains PdCu.

First Embodiment

Hereinafter, an embodiment will be descried with reference to the drawings.

A gas sensor according to the first embodiment is manufactured using a MEMS (micro electro-mechanical systems) technology. In addition, the gas sensor according to the present embodiment is mainly used as a hydrogen gas sensor.

Figure 1:
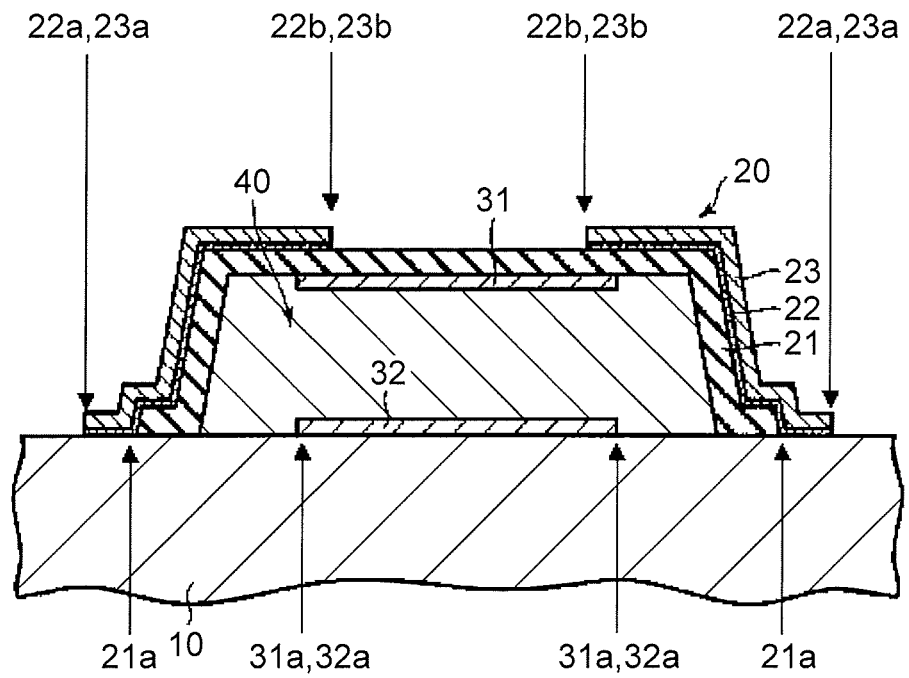
FIG. 1 is a sectional view schematically showing a configuration of a gas sensor according to an embodiment.
Figure 2:
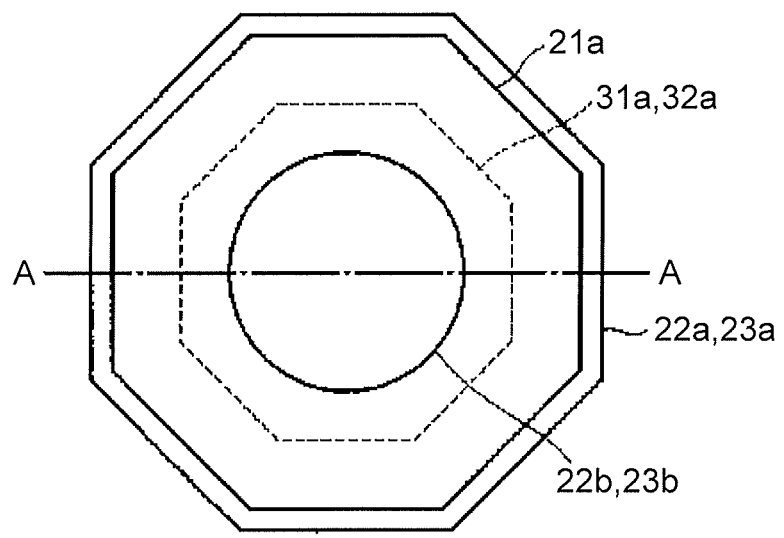
FIG. 2 is a plan view schematically showing the configuration of the gas sensor according to the embodiment.

FIG. 1 is a sectional view schematically showing a configuration of a gas sensor according to the present embodiment. FIG. 2 is a plan view schematically showing the configuration of the gas sensor according to the present embodiment. A cross section along an A-A line in FIG. 2 approximately corresponds to FIG. 1.

The gas sensor shown in FIG. 1 and FIG. 2 is provided with a base structure 10, a film structure 20, a movable electrode 31 provided between the base structure 10 and the film structure 20, and a fixed electrode 31 provided between the base structure 10 and the movable electrode 31. A cavity 40 is formed between the base structure 10 and the film structure 20, and the fixed electrode 32 is covered by the film structure 20. The movable electrode 31 and the fixed electrode 32 are opposite to each other, and a variable capacitor is formed by the movable electrode 31 and the fixed electrode 32.

In the base structure 10, a semiconductor substrate (not shown), a transistor (not shown), a wiring (not shown), an interlayer insulating film (not shown), and so on, are provided.

The film structure 20 is provided with a base layer 21, an intermediate layer (an adhesive layer) 22 provided on the base layer 21, and a sensing layer 23 provided on the intermediate layer 22.

In addition, in FIG. 1 and FIG. 2, the position relation of an outer edge 21a of the base layer 21, an outer edge 22a and an inner edge 22b of the intermediate layer 22, an outer edge 23a and an inner edge 23b of the sensing layer 23, an outer edge 31a of the movable electrode 31, and an outer edge 32a of the fixed electrode 32 is shown.

In addition, as shown in FIG. 2, patterns of the intermediate layer 22 and the sensing layer 23 as described above have each a ring-shaped plane shape. In addition, the respective outer edges 22a, 23a of the intermediate layer 22 and the sensing layer 23 are positioned outside the outer edge 21a of the base layer 21.

The base layer 21 is formed of silicon nitride (SiN) or silicon oxide (SiO), and a peripheral portion of the base layer 21 is fixed to the base structure 10. And the cavity 40 is formed inside the base layer 21. A through hole may be provided in the base layer 21 so as to equalize the pressures inside and outside the film structure 20.

The intermediate layer (the adhesive layer) 22 is provided so as to enhance adhesiveness between the base layer 21 and the sensing layer 23. The intermediate layer (the adhesive layer) 22 contains a metal material such as titanium (Ti), and tantalum (Ta), and an organic material such as a polymer. Nitrogen (N) may be further contained in the intermediate layer 22. Specifically, the intermediate layer 22 is formed of a titanium (Ti) layer, a titanium nitride (TiN) layer, a tantalum (Ta) layer or a tantalum nitride (TaN) layer. The intermediate layer 22 may be formed of a laminated layer configured by any combination of these layers.

Figure 3:
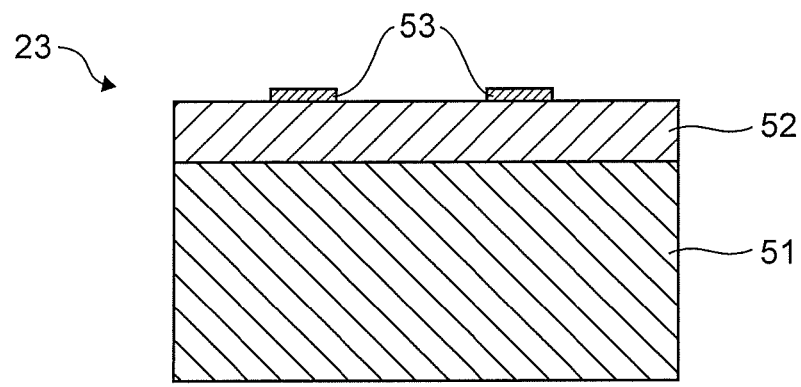
FIG. 3 is a sectional view schematically showing the sensing layer of the gas sensor according to the embodiment.

FIG. 3 is a sectional view schematically showing the sensing layer 23 of the gas sensor according to the embodiment.

The sensing layer 23 shown in FIG. 3 is provided for sensing a prescribed gas. In addition, the sensing layer 23 includes a first region 51, a second region 52 provided outside the first region 51, and a third region 53 provided outside the second region 52. In this here, "OUTSIDE" means "the direction away from the first area".

The first region 51 is a region containing metallic glass. In addition, the metallic glass indicates an amorphous alloy material having a glass transition temperature. In addition, the first region 51 is preferably of a cluster structure called a trigonal prism. In the present embodiment, a metal element to be contained in the metallic glass material is a hydrogen sensing material, and is the metal element which dissociates a hydrogen molecule into hydrogen atoms. Specifically, the metallic glass material contains at least one element selected from palladium (Pd), platinum (Pt) and gold (Au), as the metal element having the catalyst action. In addition, the metallic glass material further contains at least one element selected from silicon (Si), phosphorus (P) and boron (B), in order to enhance a desired gas sensing function. In addition, the metallic glass material further contains at least one element selected from copper (Cu), silver (Ag), nickel (Ni), gold (Au), iron (Fe) and chromium (Cr), in order to enhance the desired gas sensing function. In the present embodiment, the first region 51 is a region containing PdCuSi, and in PdCuSi, Pd or Cu is arranged at each of the apexes composing the trigonal prism, and Si is arranged in the center thereof. Pd or Cu, and Si are covalently bonded. A thickness of the first region 51 is preferably not less than several hundreds nm and not more than several μm, because a film thickness of the first region 51 can be easily controlled using a sputtering method, and in the first region 51, sufficient variation can be obtained as an actuator of the MEMS structure.

The second region 52 is a region containing a metallic glass material in which a concentration of at least one element selected from silicon (Si), phosphorus (P) and boron (B) is lower than that of the first region 51. In the present embodiment, the second region 52 is a region in which a concentration of Si in PdCuSi in the first region 51 is low. This is, because a concentration of Si is reduced, since oxygen in the atmosphere reacts with Si of PdCuSi to aggregate as Si oxide, for example, and the second region 52 becomes approximately PdCu. A thickness of the second region 52 is preferably not less than several nm and not more than several hundreds nm, because a material bonded in the second region 52 is easily desorbed when heated. In addition, it is preferable that a ratio of the thickness of the first region 51 to the thickness of the second region 52 is not less than 1 and not more than 1000, because the thickness of the second region 52 is equal to or sufficiently smaller than the thickness of the first region 51, and gas absorption property is not affected.

The third region 53 is a region containing an oxide which is formed when at least one element selected from silicon (Si), phosphorus (P) and boron (B) reacts with oxygen in the atmosphere. The third region 53 is not formed uniformly, but formed in a spot-like state, when seen from the outside. That is, when seen from the outside, the second region 52 and the third region 53 are exposed, and the surfaces thereof contact with the atmosphere. In the present embodiment, the third region 53 is a region containing $SiO_x$. A thickness of the third region 53 is preferably not less than several um and not more the several tens nm, because the third region 53 is sufficiently thinner than the first region 51, and the gas absorption property is not affected.

For example, a case in which PdCuSi metallic glass is used as the sensing layer 23 will be described. It is known that when a semimetal element such as Si is contained in PdCuSi by a prescribed ratio (for example, about 15-10 atomic %), a good amorphous structure (metallic glass) is obtained. Since PdCuSi has an amorphous structure (metallic glass) like this, PdCuSi does not form a hydride at the time of hydrogen absorption, and has a good hydrogen absorption and desorption property. In addition, Since PdCuSi having the amorphous structure (metallic glass) like this has a low density, a hydrogen atom can move in PdCuSi at high speed, and thereby a high speed response property can be realized.

The movable electrode 31 is connected to the film structure 20, and is provided on the lower surface of the base layer 21. More specifically, the whole of the pattern of the movable electrode 31 is in contact with the lower surface of the base layer 21. The movable electrode 31 functions as an upper electrode of the variable capacitor. A material of the movable electrode 31 is an AlCu alloy, for example.

The fixed electrode 32 is provided on the base structure 10, and is opposite to the movable electrode 31. The fixed electrode 32 functions as a lower electrode of the variable capacitor. A material of the fixed electrode 32 is an AlCu alloy, for example.

When the sensing layer 23 absorbs a prescribed gas (in the present embodiment, a hydrogen gas), the sensing layer 23 expands. As a result, a strain is generated in the sensing layer 23, and the sensing layer 23 is deformed. For example, a central portion of the sensing layer 23 is deformed downward (recessed downward). The sensing layer 23 is deformed, and thereby the whole of the film structure 20 is deformed. In accordance with deformation of the film structure 20, the movable electrode 31 is deformed, and thereby a distance between the movable electrode (the upper electrode) 31 and the fixed electrode (the lower electrode) 32 changes. As the distance between the movable electrode 31 and the fixed electrode 32 changes, a capacitance of the variable capacitor formed by the movable electrode 31 and the fixed electrode 32 changes. A hydrogen absorption amount of the sensing layer 23 can be detected by detecting a change amount of the capacitance, and thereby a hydrogen concentration around the sensing layer 23 can be detected.

Figure 4:
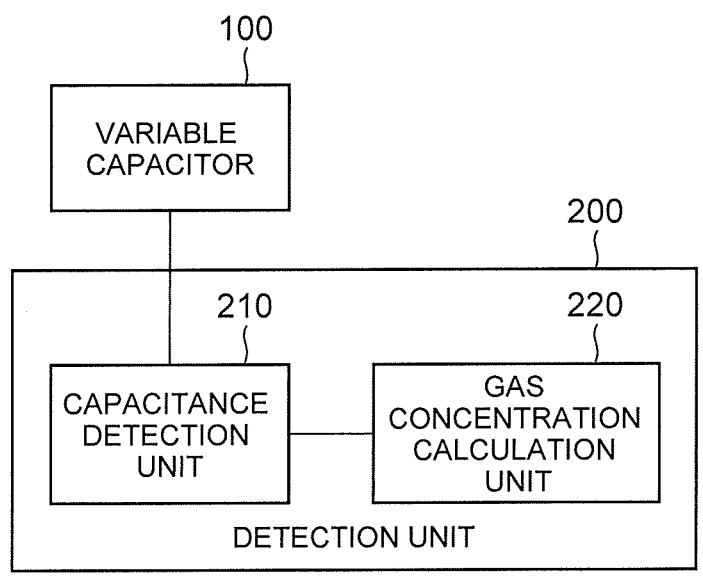
FIG. 4 is a block diagram showing a fundamental configuration of a gas detection system using the gas sensor according to the embodiment.

FIG. 4 is a block diagram showing a fundamental configuration of a gas detection system (a hydrogen gas detection system) using the above-described gas sensor (the hydrogen gas sensor).

In the gas detection system shown in FIG. 4, a variable capacitor 100 is configured by the movable electrode (the upper electrode) 31 and the fixed electrode (the lower electrode) 32 as described above, and a detection unit 200 is connected to the variable capacitor 100. The detection unit 200 may be provided inside the base structure 10 of FIG. 1, or may be provided outside the base structure 10. The detection unit 200 includes a capacitance detection unit 210 to detect a capacitance of the variable capacitor 100, and a gas concentration calculation unit 220 to calculate a gas concentration (a hydrogen gas concentration) based on the capacitance detected by the capacitance detection unit 210. The relation between a capacitance of the variable capacitor 100 and a gas concentration (a hydrogen gas concentration) is obtained in advance, and thereby the gas concentration (the hydrogen gas concentration) can be calculated by the gas concentration calculation unit 220.

For example, Pd is general as a hydrogen sensing layer material, but it has been reported that Pd is poisoned by a sulfur (S) containing material. Sulfur (S) poisoning of Pd proceeds in two stages. To begin with, when a sulfur (S) containing material such as $H_2S$ and $SO_2$ approaches Pd, the Pd surface bonds with S. Then, the poisoning proceeds inside Pd, and $Pd_4S$ is formed therein. S on the Pd surface is desorbed by a heat treatment and so on, but $Pd_4S$ formed inside Pd is irreversible and cannot be removed. $Pd_4S$ acts as a catalytic capability deteriorated material which has lost an operation as a hydrogen catalyst, and thereby the hydrogen sensing property is deteriorated.

On the other hand, the gas sensor according to the present embodiment includes, in the sensing layer 23, the first region 51, the second region 52 to be provided outside the first region 51, and the third region 53 to be provided outside the second region 52. For example, when the first region 51 contains PdCuSi, since PdCuSi forms a trigonal prism, and Pd or Cu covalently bonds with Si in the trigonal prism, and thereby Pd or Cu cannot bond with S. Accordingly, PdCuSi does not bond with S. The second region 52 is a region in which a Si concentration is lower than that in the first region 51, and accordingly is a region in which more PdCu exists than in the first region 51. When S approaches PdCu, PdCu forms Pd—S or Cu—S. S in Pd—S or Cu—S does not diffuse into the first region 51. In addition, the second region 52 is extremely thin, S in Pd—S or Cu—S can be easily desorbed as $SO_x$ by a heat treatment. In addition, the third region 53 is a region containing $SiO_x$ to be formed by a reaction of Si in PdCuSi with oxygen in the atmosphere. In addition, the third region 53 does not bond with S. Since $SiO_x$ does not become a catalyst for hydrogen, if $SiO_x$ is provided uniformly seen from the outside, the hydrogen sensing might be disturbed, but since $SiO_x$ is provided in a spot-like state seen from the outside, the hydrogen sensing is not disturbed. Accordingly, in the gas sensor according to the present embodiment, a catalytic capability deteriorated material is not formed inside the sensing layer 23, and even if the surface of the sensing layer (the second region 52) is poisoned, the gas sensor can be refreshed only by being heated. As a result, it becomes possible to obtain the gas sensor superior in property and reliability.

Figures 5A, 5B:
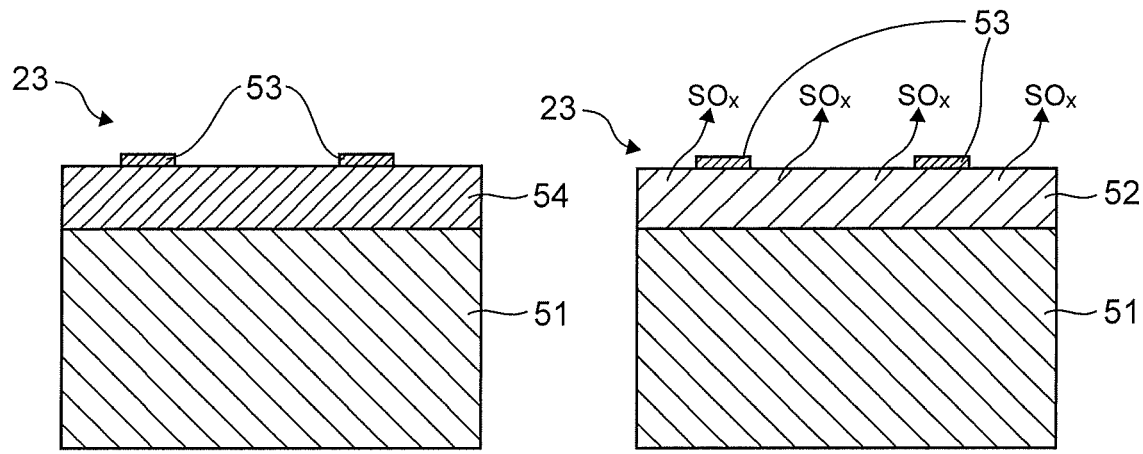
FIG. 5A is a diagram showing the sensing layer which has been exposed to a sulfur containing material and has been sulfur positioned.
FIG. 5B is a diagram showing the sensing layer which has been sulfur poisoned and then has been heated.

FIG. 5A is a diagram showing the sensing layer 23 which has been exposed to an S containing material and has been S poisoned, and FIG. 5B is a diagram showing the sensing layer 23 which has been S poisoned and then has been heated.

As shown in FIG. 5A, when the sensing layer 23 is exposed to 50 ppm $H_2S$ for 60 minutes, the second region 52 is S poisoned, and thereby a region 54 is formed. In addition, as shown in FIG. 5B, the sensing layer 23 including the region 54 is annealed at 200° C. for 10 minutes in an uncontrolled atmosphere, and S in the region 54 becomes $SO_x$ and is desorbed, and thereby the region 54 becomes the second region 52 again.

Figure 6:
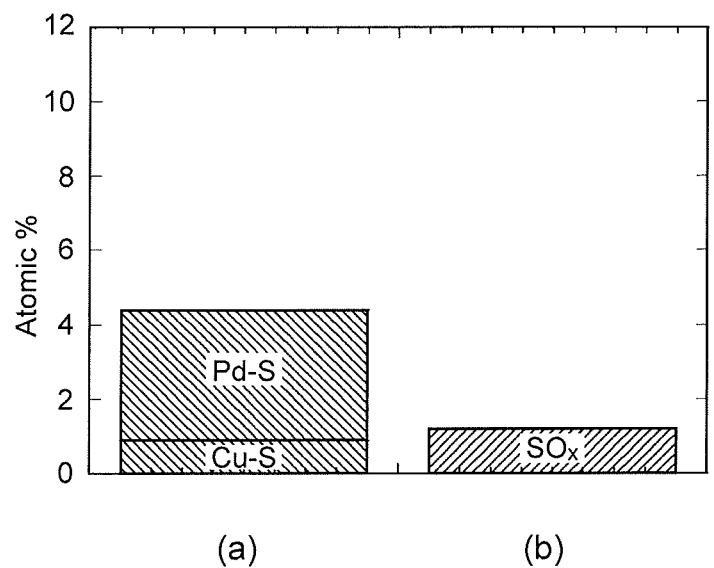
FIG. 6 shows diagrams (a) and (b) showing results in which bond states of the second regions of FIGS. 5A, 5B and sulfur are respectively analyzed by an XPS (X-ray Photoelectron Spectroscopy).

FIG. 6 includes diagrams (a) and (b) showing results in which bond states of the second regions 52 of FIGS. 5A, 5B and S are respectively analyzed by an XPS (X-ray Photoelectron Spectroscopy). The diagram (a) in FIG. 6 shows an analysis result after the sensing layer 23 has been exposed to 50 ppm $H_2S$ at the room temperature for 60 minutes. The diagram (b) in FIG. 6 shows an analysis result after the sensing layer 23 of the diagram (a) in FIG. 6 has been annealed under the condition of 200° C., 10 minutes.

As shown in the diagram (a) in FIG. 6, when the sensing layer 23 has been exposed to $H_2S$, Pd—S and Cu—S have been detected in the second region 52. Accordingly, it is found that the sensing layer 23 has been S poisoned under the above-described condition. In addition, the sensing layer 23 is annealed at 200° C. for 10 minutes after the sensing layer 23 has been S poisoned, and thereby S is reduced, and the whole remaining S atoms have become in a state of $SO_x$. Accordingly, it is found that when the sensing layer 23 which has been S poisoned is heated, S is desorbed from the second region 52.

Figure 7:
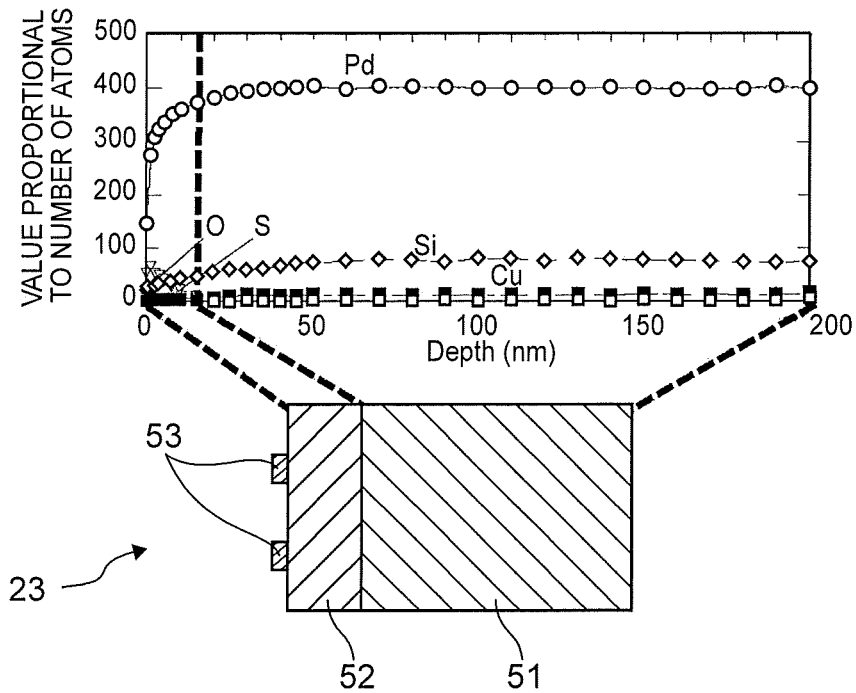
FIG. 7 is a diagram showing a result in which changes in the numbers of respective atoms in the sensing layer in FIG. 5A are analyzed.

FIG. 7 is a diagram showing a result in which changes in the numbers of respective atoms of the sensing layer 23 in FIG. 5A are analyzed. An analysis method to be used in FIG. 7 is an X-ray photoelectron spectroscopy (X-ray Photoelectron Spectroscopy, XPS).

As shown in FIG. 7, it is found that S only exists in a region in which a Si amount is small at the surface. That is, it is indicated that S exists only in the second region 52. In addition, it is found that S does not diffuse into PdCuSi. That is, it is indicated that S does not exist in the first region 51.

Next, a heating temperature for refreshing the sensing layer 23 will be described.

Figure 8:
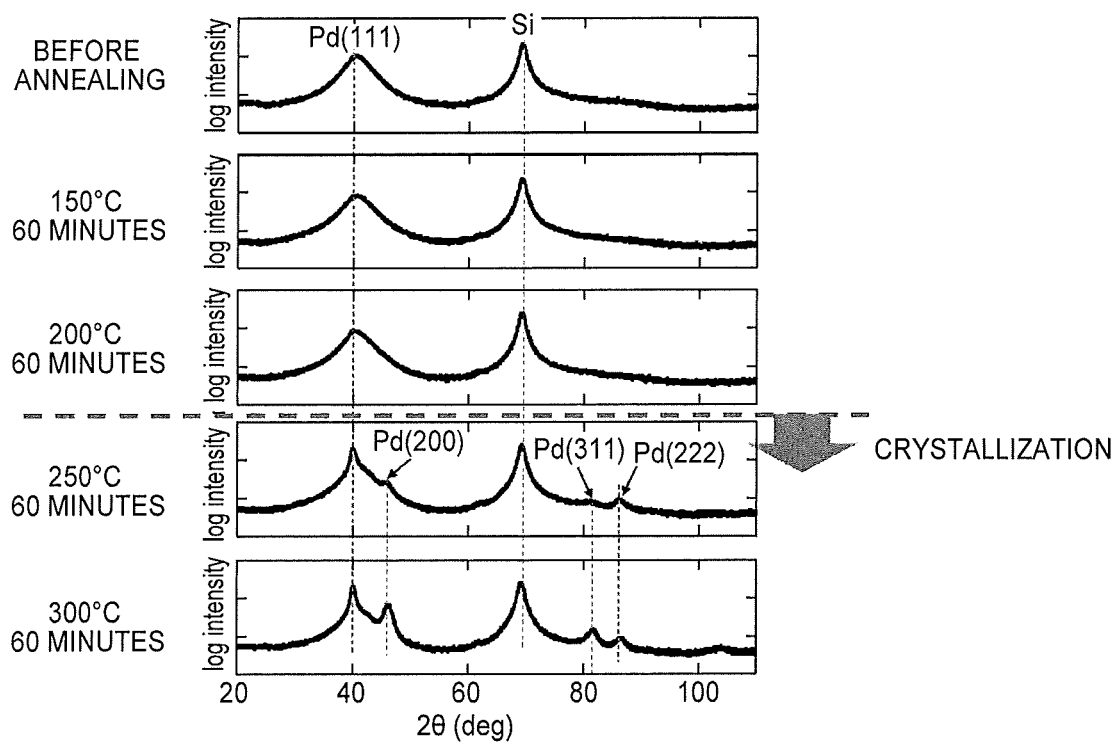
FIG. 8 is a diagram showing the relation between a crystalline structure and a temperature of the PdCuSi metallic glass.

FIG. 8 is a diagram showing the relation between the degree of the crystallization and the annealing temperature of PdCuSi metallic glass. An analysis method to be used in FIG. 8 is an X-ray diffraction (X-ray Diffraction, XRD). In addition, the PdCuSi metallic glass which has been analyzed is $Pd_{78.7}Cu_{4.6}Si_{16.7}$.

As shown in FIG. 8, the relation between the degree of crystallization and the annealing temperature when the PdCuSi metal glass was annealed in uncontrolled atmosphere is indicated. For example, when a case of before annealing is seen, peaks are respectively observed when $2\theta=40°$, $69°$. These two peaks derive respectively from Pd (111) and the Si substrate. These peaks can be observed in any conditions of before annealing, 150° C. 60 minutes, 200° C. 60 minutes, 250° C. 60 minutes, 300° C. 60 minutes. However, with respect to the PdCuSi metallic glasses which have been annealed in an uncontrolled atmosphere in the conditions of 250° C. 60 minutes, 300° C. 60 minutes, respectively, peaks appear when $2\theta=46°$ (Pd(200)), $2\theta=81°$ (Pd(311)), $2\theta=87°$ (Pd(222)) (described by arrows in FIG. 8), respectively, compared with the conditions of before annealing, 150° C. 60 minutes, 200° C. 60 minutes. These peaks are peaks which caused to appear after crystallization of Pd of the PdCuSi metallic glass begins. Accordingly, it has been found that when the PdCuSi metallic glass is heated at not less than 250° C., the crystallization might begin, and thereby the PdCuSi metallic glass cannot keep a metallic glass state.

Figure 9:
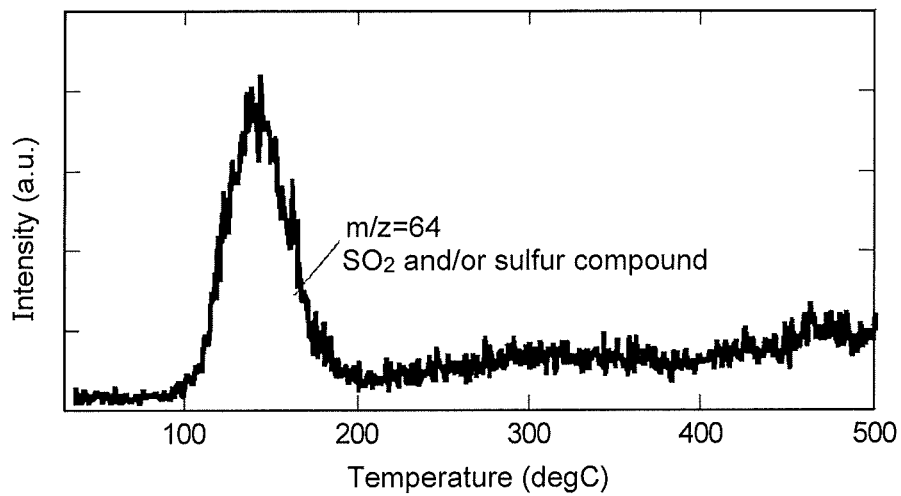
FIG. 9 is a diagram showing a sulfur desorption temperature of the S poisoned sensing layer.

FIG. 9 is a diagram showing an S desorption temperature of the sensing layer 23 which has been S poisoned. An analysis method to be used in FIG. 9 is a TDS (Thermal desorption gas analysis method).

As shown in FIG. 9, a peak appears at between about 100° C. to 200° C. This peak indicates that S begins to desorb from the sensing layer 23 as $SO_2$ or a sulfur compound at not less than about 100° C., and S virtually desorbs at not less than about 200° C.

From the above-described result, a heating temperature for refreshing the S poisoned gas sensor is preferably not less than 100° C., and lower than 250° C. As described above, since S virtually desorbs at not less than 200° C., the heating temperature is more preferably not less than 200° C., and lower than 250° C.

Figure 10A:
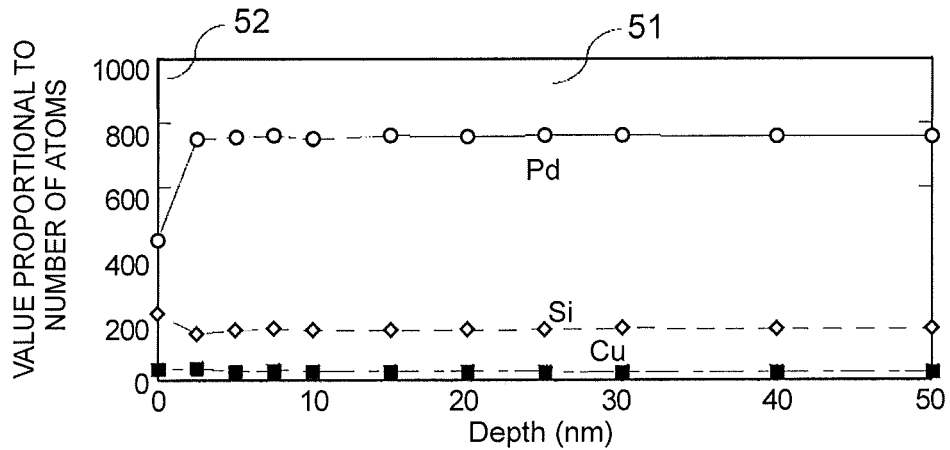
FIGS. 10A, 10B are diagrams each showing the relation between a manufacturing method and a thickness of the second region.
Figure 10B:
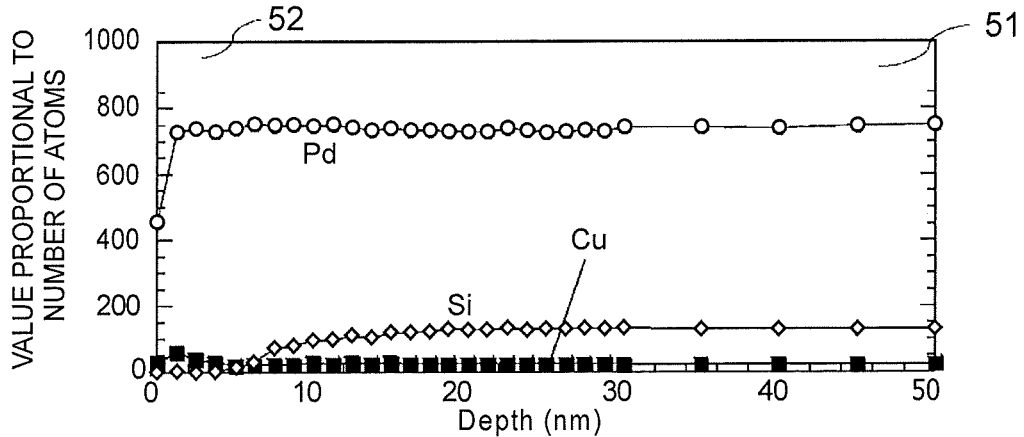

FIGS. 10A, 10B are diagrams each showing the relation between a manufacturing method and a thickness of the second region 52. An analysis method to be used in FIGS. 10A, 10B is an XPS.

FIG. 10A indicates a case in which PdCuSi metallic glass is exposed to the uncontrolled atmosphere for several days for manufacturing the second region 52. In the case of exposing the PdCuSi metallic glass to the uncontrolled atmosphere, a thickness of the second region 52 became about 2 nm. FIG. 10B indicates a case in which $O_2/CF_4$ ashing is performed to PdCuSi metallic glass for 20 minute, and then $H_2$ reduction is performed to the PdCuSi metallic glass. In the case of performing ashing, a thickness of the second region 52 became about 7 nm. It has been found that in the case of performing ashing, a thickness of the second region 52 tends to become larger, compared with the case of exposing the PdCuSi metallic glass to the uncontrolled atmosphere. In addition, a thickness of the second region 52 can be controlled to a thickness of about 2 nm—several tens nm, by arbitrarily changing a temperature and a gas type that are conditions at the time of performing ashing. If a preferable range of a thickness of the second region 52 is not more than several tens nm, from the viewpoint of the ease of S desorption, S is easily desorbed when heated.

From the above-described result, the gas sensor according to the present embodiment includes, in the sensing layer 23, the first region 51, the second region 52 to be provided outside the first region 51, and the third region 53 to be provided outside the second region 52, the catalytic capability deteriorated material is not formed inside the sensing layer 23, and even if the surface of the sensing layer 23 (the second region 52) is poisoned, the gas sensor can be refreshed only by being heated. As a result, it is possible to obtain the high performance gas sensor superior in property and reliability.

Second Embodiment

Here, a gas sensor of a second embodiment will be described. Points different from the first embodiment will be mainly described.

Figure 11A:
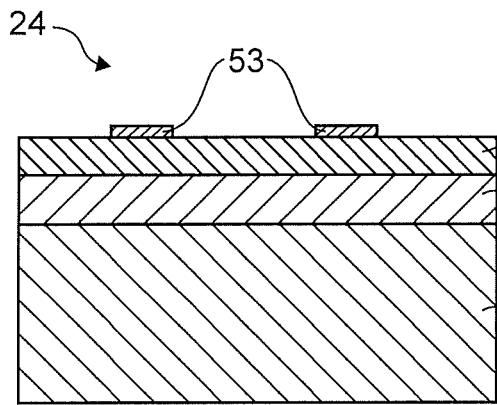
FIGS. 11A, 11B are sectional views each schematically showing a sensing layer of a gas sensor according to an embodiment.
Figure 11B:
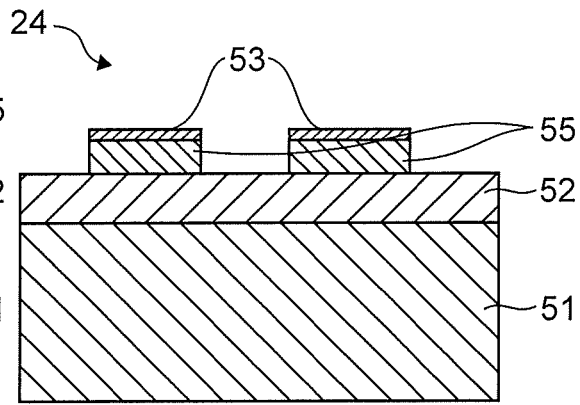

FIGS. 11A, 11B are sectional views each schematically showing a sensing layer 24 according to the embodiment.

Specifically, the gas sensor according to the second embodiment includes a cap region 55 for preventing oxidation of the sensitivity layer 23. In the present embodiment, the sensing layer 23 including the cap region 55 is called a sensing layer 24.

The cap region 55 is provided between the second region 52 and the third region 53 so as to prevent an element contained in the sensing layer 24 from being oxidized. That is, the cap region 55 is included in the vicinity of the surface of the sensing layer 24. With respect to forming of the cap region 55, a film of an element for forming the cap region 55 is formed on the surface of the metallic glass before the metallic glass is exposed under an oxygen atmosphere, and then when the metallic glass is exposed under an oxygen atmosphere, the second region 52 and the third region 53 are formed, and the cap region 55 is formed therebetween. An element for forming the cap region 55 is preferably an element (a first element) having a catalyst action to dissociate a hydrogen molecule into hydrogen atoms, or the same element (a second element) as the prescribed element contained in the sensing layer 23. Specifically, the cap region 55 contains, as the first element, at least one element selected from palladium (Pd), platinum (Pt) and gold (Au). Or, the cap region 55 contains, as the second element, at least one element selected from silicon (Si), phosphorus (P) and boron (B). In the present embodiment, since the sensing layer 23 is formed of the PdCuSi metallic glass, the cap region 55 is formed of palladium (Pd) or silicon (Si). FIG. 11A is a diagram showing a shape of the cap region 55 when palladium (Pd) is used as the cap region 55. When palladium (Pd) is used as the cap region 55, since palladium (Pd) passes hydrogen gas, the hydrogen sensing is not disturbed. When exposed under an oxygen atmosphere, palladium (Pd) is hardly oxidized, and thereby it is possible to make the second region 52 which is made by oxidizing the PdCuSi metallic glass thin. FIG. 11B is a diagram showing a shape of the cap region 55 when silicon (Si) is used as the cap region 55. When silicon (Si) is used as the cap region 55, since silicon is oxidized to become $SiO_x$, the third region 53 and the cap region 55 are integrated with $SiO_x$. That is, a ratio of the third regions 53 existing in a spot-like state becomes larger, compared with a case in which the cap region 55 is not provided. Accordingly, a ratio of the surface of the sensing layer 24 which reacts with oxygen becomes smaller, and thereby, the surface of the sensing layer 24 becomes to be hardly oxidized, and the second region 52 becomes thinner.

It is preferable that a thickness of the cap region 55 is thinner than 1/10 of a thickness of the sensing layer 24. This is because if the cap region 55 is too thick, hysteresis might be generated in the hydrogen absorption and desorption property. Specifically, it is preferable that a thickness of the cap region 55 is in a thickness range from a thickness of one atom layer to about 10 nm.

The gas sensor according to the present embodiment is provided with the cap region 55, and thereby can prevent oxidation of the metallic glass, in addition to the effect of the gas sensor according to the first embodiment. Since the oxidation of the metallic glass is prevented, the second region 52 becomes thinner, and thereby becomes to be hardly S poisoned. Even if the surface of the sensing layer 24 (the second region 52) is poisoned, the gas sensor can be refreshed only by being heated. As a result, it is possible to obtain the high performance gas sensor superior in property and reliability.

Third Embodiment

Here, a gas sensor of a third embodiment will be described. Points different from the first embodiment will be mainly described.

Figure 12:
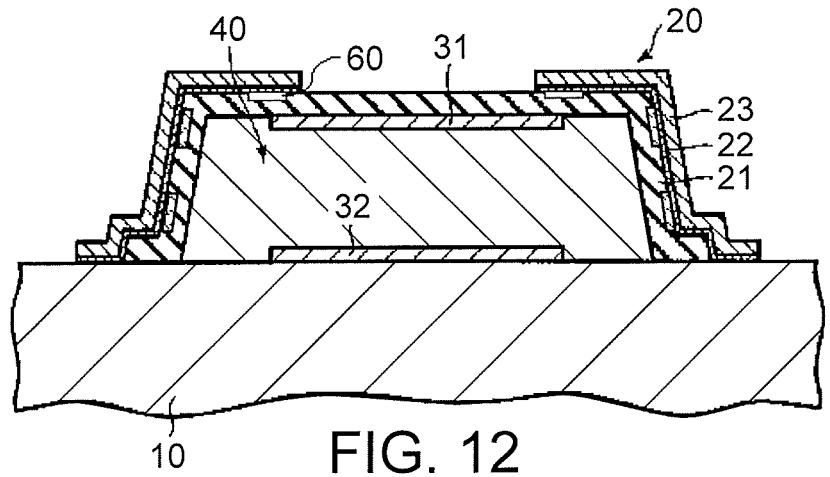
FIG. 12 is a sectional view schematically showing a configuration of a gas sensor according to an embodiment.

FIG. 12 is a sectional view schematically showing a configuration of a gas sensor according to the embodiment.

Specifically, the gas sensor according to the third embodiment is provided with a heater 60 capable of heating at least the second region 52. The heater 60 is electrically connected to an external circuit via a lead wire (not shown). A current is flowed in the heater 60 via the lead wire to generate heat. The heater 60 is a heating device such as a built-in heater, for example.

In the present embodiment, an installation place of the heater 60 is provided between the base layer 21 and the sensing layer 23. In addition, a plurality of the heaters 60 are provided separately to each other. The more closer the heater 60 is provided to the sensing layer 23, the more efficiently the second region 52 can be heated.

The gas sensor according to the present embodiment incorporates the heating devices in the gas sensor, and thereby can heat the second region 52 efficiently, in addition to the effect of the gas sensor according to the first embodiment. As a result, it is possible to obtain the high performance gas sensor superior in property and reliability.

In addition, with respect to the installation place of the heater 60, without being limited to the example of FIG. 12, the heater 60 may be provided at a position where the heater 60 comes in contact with the sensing layer 23 or at a position via an insulating film, and as long as the heater 60 can heat at least the second region 52, the heater 60 may be installed at any position.

(Modification)

Next, modifications of the first embodiment will be described.

Figure 13:
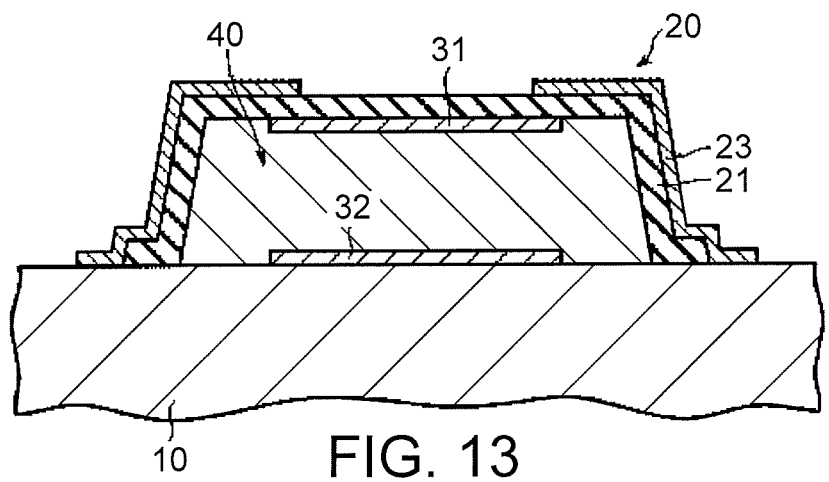
FIG. 13 is a sectional view schematically showing a configuration of a first modification of the gas sensor according to the embodiment.

FIG. 13 is a sectional view schematically showing a configuration of a first modification of the gas sensor according to the present embodiment. In the above-described embodiments, the intermediate layer 22 is provided between the base layer 21 and the sensing layer 23, but in the present modification, the intermediate layer 22 is not provided. In this manner, the film structure 20 may be configured by the base layer 21 and the sensing layer 23.

Figure 14:
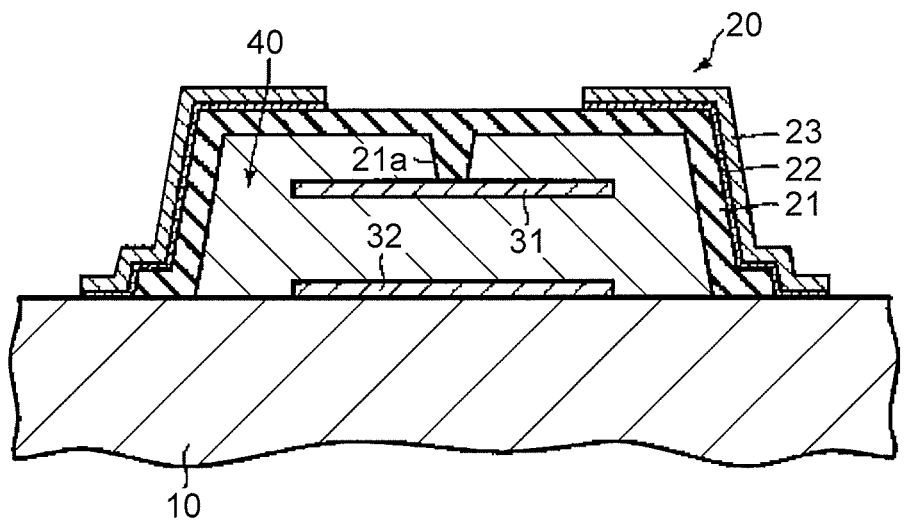
FIG. 14 is a sectional view schematically showing a configuration of a second modification of the gas sensor according to the embodiment.

FIG. 14 is a sectional view schematically showing a configuration of a second modification of the gas sensor according to the present embodiment. In the above-described embodiments, the whole pattern of the movable electrode 31 has been provided on the lower surface of the film structure 20. In the present modification, a projection portion 21c is provided in the base layer 21, and the movable electrode 31 is connected to a tip of the projection portion 21c. When the sensing layer 23 absorbs the gas (the hydrogen gas) and the film structure 20 is deformed, the movable electrode 31 connected to the film structure 20 is displaced in the vertical direction. As a result, the distance between the movable electrode (the upper electrode) 31 and the fixed electrode (the lower electrode) 32 varies, and thereby a variable capacitor can be configured. Accordingly, it is possible to realize the excellent gas sensor (the hydrogen sensor) based on the same principle as the above-described embodiments. In addition, the intermediate layer 22 may be omitted.

Figure 15:
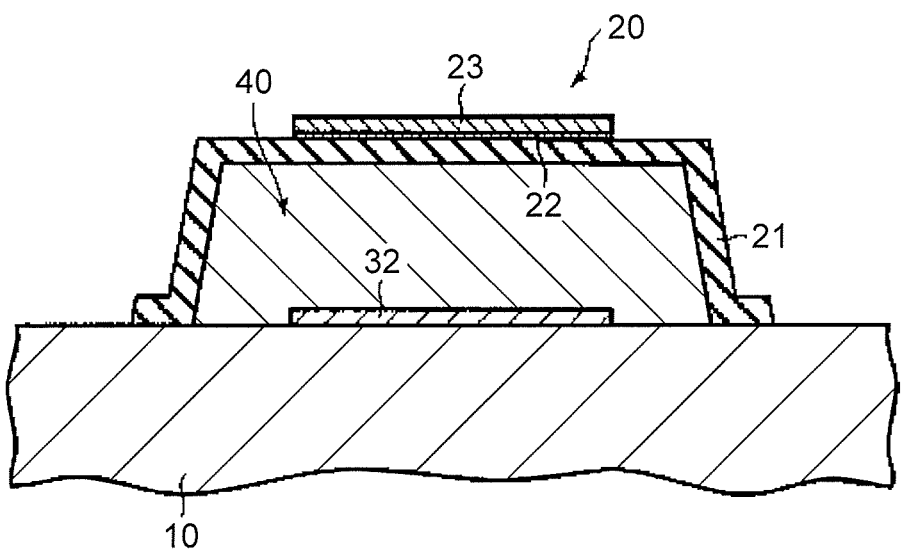
FIG. 15 is a sectional view schematically showing a configuration of a third modification of the gas sensor according to the embodiment.

FIG. 15 is a sectional view schematically showing a configuration of a third modification of the gas sensor according to the present embodiment. In the above-described embodiments, the sensing layer 23 and the movable electrode 31 have been provided separately, but in the present modification, the sensing layer 23 functions also as a movable electrode. In this manner, since the sensing layer 23 is used also as the movable electrode, the intermediate layer 22 and the sensing layer 23 are provided on the upper surface of the base layer 21. Even in the structure like this, the distance between the movable electrode (the sensing layer 23) and the fixed electrode 32 varies in accordance with the deformation of the sensing layer 23, and thereby a variable capacitor can be configured. Accordingly, it is possible to realize the excellent gas sensor (the hydrogen sensor) based on the same principle as the above-described embodiments. In addition, in the present modification, the intermediate layer 22 may be omitted as well.

In addition, in the above-described embodiments, the gas sensor of the capacitor detection type which detects a gas concentration based on change of the capacitance between the movable electrode (the upper electrode) and the fixed electrode (the lower electrode) has been described, but it is possible to apply the configurations of above-described embodiments to a gas sensor of a resistance detection type as well. In the gas sensor of the resistance detection type, the sensing layer absorbs the gas, and thereby a resistance of the sensing layer changes. It is possible to apply the configurations of the above-described embodiments to the gas sensor of the resistance detection type like this as well. However, when the configurations of the above-described embodiments are applied to the gas sensor of the resistance detection type, since a resistance of the sensing layer itself is detected, it is not necessary to provide the movable electrode and the fixed electrode.

In addition, the sensing layer 24 may be used as each of the sensing layers 23 of FIG. 13 to FIG. 15.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A gas sensor comprising:
   a substrate;
   a sensing layer;
   a first electrode provided between the substrate and the sensing layer;
   a second electrode provided between the substrate and the first electrode; and
   the sensing layer comprising:
      a third region including SiOx;
      a first region including PdCuSi provided between the third region and the first electrode;
      second region including PdCu provided between the third region and the first region; and
      a cap film including at least one element selected from palladium (Pd), platinum (Pt), gold (Au), silicon (Si), phosphorus (P) and boron (B), and formed between the second region and the third region;
   wherein a capacitance between the first electrode and the second electrode changes according to the absorption of a gas in the sensing layer.

2. The gas sensor according to claim 1, wherein:
   a thickness of the second region is less than a thickness of the first region.

3. The gas sensor according to claim 1, wherein:
   the third region is on the second region.

4. The gas sensor according to claim 1, wherein:
   a thickness of a first portion of the third region is more than a thickness of a second portion of the third region.

5. The gas sensor of claim 1, further comprising a first portion comprising the third region on the second region and a second portion not comprising the third region on the second region.

6. The gas sensor according to claim 1, wherein:
   a silicon (Si) concentration in the second region is less than the silicon (Si) concentration in the first region.

7. The gas sensor according to claim 1, wherein:
   the first region comprises metallic glass.

8. The gas sensor according to claim 1, wherein:
   the gas sensor further comprising a heater, being adjacent to the sensing layer.

9. The gas sensor according to claim 1, wherein:
   the sensing layer has the second region capable of combining with sulfur(S) provided outside the first region, an amount of a sulfur(S) comprised in the first region is equal to or less than an amount of sulfur(S) comprised in the second region.

10. The gas sensor according to claim 1, wherein:
the sensing layer being capable of absorbing hydrogen.

11. A gas sensor comprising:
a substrate;
a sensing layer;
a first electrode provided between the substrate and the sensing layer;
a second electrode provided between the substrate and the first electrode; and
the sensing layer comprising:
   a third region including SiOx;
   a first region including PdCuSi provided between the third region and the first electrode;
   a second region including PdCu provided between the third region and the first region; and
   a film including at least one element selected from palladium (Pd), platinum (Pt), gold (Au), silicon (Si), phosphorus (P) and boron (B), and formed between the second region and the third region.

12. The gas sensor according to claim 11, wherein:
a thickness of the second region is less than a thickness of the first region.

13. The gas sensor according to claim 12, wherein:
the third region is on the second region.

14. The gas sensor according to claim 11, wherein:
a thickness of a first portion of the third region is more than a thickness of a second portion of the third region.

15. The gas sensor according to claim 11,
further comprising a first portion comprising the third region on the second region and a second portion not comprising the third region on the second region.

16. The gas sensor according to claim 11, wherein:
a concentration of silicon (Si) in the second region is less than a concentration of silicon (Si) in the first region.

17. The gas sensor according to claim 11, wherein:
the first region comprises metallic glass.

18. The gas sensor according to claim 11, wherein:
the gas sensor further comprising a heater, the heater is adjacent to the sensing layer.

19. The gas sensor according to claim 11, wherein:
the sensing layer being capable of absorbing hydrogen.

* * * * *